(12) United States Patent
Kura et al.

(10) Patent No.: US 8,773,122 B2
(45) Date of Patent: Jul. 8, 2014

(54) HALL ELEMENT CONTROL CIRCUIT

(75) Inventors: Takeshi Kura, Ogaki (JP); Hiroyuki Tsuda, Ichinomiya (JP); Tomonori Kamiya, Ichinomiya (JP); Hiroki Nagai, Aichi-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 438 days.

(21) Appl. No.: 13/153,013

(22) Filed: Jun. 3, 2011

(65) Prior Publication Data

US 2011/0298453 A1 Dec. 8, 2011

(30) Foreign Application Priority Data

Jun. 3, 2010 (JP) ................................. 2010-127596

(51) Int. Cl.
*G01R 33/06* (2006.01)

(52) U.S. Cl.
USPC ........................................ 324/251; 324/207.2

(58) Field of Classification Search
USPC ............................................ 324/207.21, 251
See application file for complete search history.

(56) References Cited

U.S. PATENT DOCUMENTS 4,734,594 A    3/1988    Nelson

FOREIGN PATENT DOCUMENTS

| JP | 62-92477     | 12/1986 |
| JP | 2006-010370  | 1/2006  |
| JP | 2006-79471   | 3/2006  |
| JP | 2006-079471  | 3/2006  |
| JP | 2009-156642  | 7/2009  |
| TW | 200511593    | 3/2005  |

OTHER PUBLICATIONS

Taiwanese Notice of Rejection issued in Application No. 100115902 dated Jul. 30, 2013.

*Primary Examiner* — Reena Aurora

(57) ABSTRACT

A first terminal supplies the bias voltage to a high-potential-side input terminal of a hall element. A second terminal supplies the ground potential to a low-potential-side input terminal of the hall element. A P-channel type transistor is configured such that the source terminal is connected to the power supply potential and the drain terminal is connected to the first terminal. An operational amplifier differentially amplifies the voltage between a predetermined set voltage and the voltage at the first terminal so as to control the gate voltage of the P-channel type transistor.

3 Claims, 7 Drawing Sheets

HALL ELEMENT CONTROL CIRCUIT

This application is based upon and claims the benefit of priority from the prior Japanese Patent Application No. 2010-127596, filed on Jun. 3, 2010, the entire content is incorporated herein by reference.

BACKGROUND OF THE INVENTION

1. Field of the Invention

The present invention relates to a hall element control circuit for supplying a constant-current bias current to a hall element.

2. Description of the Related Art

Hall elements are elements used to detect the position of an object. For example, the hall elements are used to detect the lens position in an autofocus control of a camera. Generally, the hall elements are driven by a constant current in order to eliminate adverse effects caused by variations in the elements and a change in the environments.

Many of mobile phones and smart phones available today are provided with built-in cameras and also a camera having an auto-focusing function is in practical use today. A smaller size and a further simplified structure are required for the camera module mounted on such a mobile phone and its input-output wiring.

SUMMARY OF THE INVENTION

A hall element control circuit according to one embodiment of the present invention is connected to a hall element via a wiring member and controls the hall element, and it includes: a first terminal for supplying a bias voltage to a high-potential-side input terminal of the hall element; a second terminal for supplying a ground potential to a low-potential-side input terminal of the hall element; a transistor whose source terminal is connected to a power supply potential and whose drain terminal is connected to the first terminal; and an operational amplifier for controlling a gate voltage of the transistor by differentially amplifying a voltage between a predetermined set voltage and a voltage at the first terminal.

Another embodiment of the present invention provides a focus control circuit. The focus control circuit is a focus control circuit mounted on an image pickup apparatus including a lens, a driver element for adjusting the position of the lens, and a position detecting element for detecting the position of the lens, and this focus control circuit includes: an equalizer configured to generate a control signal used to adjust the position of the lens to a target position based on a difference between the position of the lens identified by an output signal of the hall element and the target position which is set externally; a PWM modulator configured to generate a PWM signal according to the control signal generated by the equalizer; a driver unit configured to generate a drive current used to drive the driver element according to the PWM signal generated by the PWM modulation unit; and the above-described hall element control circuit.

Still another embodiment of the present invention provides an image pickup apparatus. The image pickup apparatus includes: a lens; image pickup devices for converting light transmitted through the lens into an electrical signal; a driver element for adjusting the position of the lens; a hall element for detecting the position of the lens; an image signal processor for determining a target position of the lens based on an output signal of the image pickup devices; and the above-described focus control circuit for driving the driver element.

Optional combinations of the aforementioned constituting elements, and implementations of the invention in the form of methods, apparatuses, systems and so forth may also be effective as additional modes of the present invention.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1:
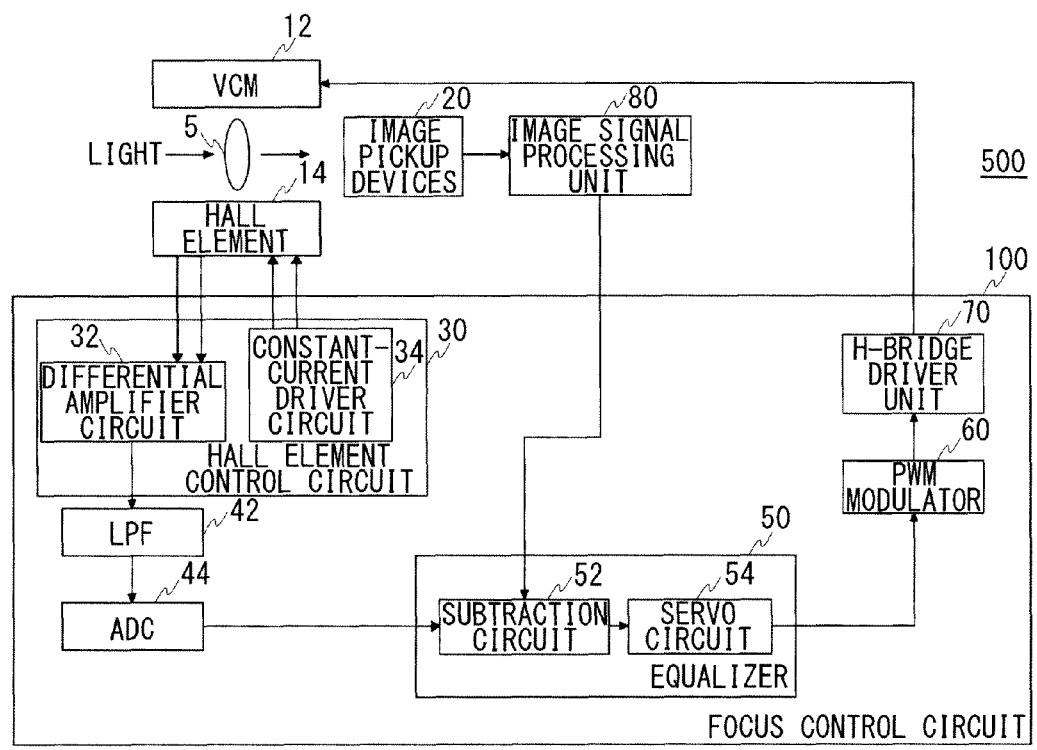
FIG. 1 shows a structure of an image pickup apparatus provided with a focus control circuit that includes a hall element control circuit according to an embodiment of the present invention.

FIG. 1 shows a structure of an image pickup apparatus 500 provided with a focus control circuit 100 that includes a hall element control circuit 30 according to an embodiment of the present invention. The image pickup apparatus 500 includes a lens 5, a voice coil motor (VCM) 12, a hall element 14, image pickup devices 20, an image signal processor (ISP) 80, and an autofocus control circuit 100. Other structural components, such as an image coding engine and a recording medium, which are not involved in an auto-focus control are omitted in FIG. 1.

The image pickup devices 20 convert the light signals transmitted through the lens 5, which is an optical component, into electric signals and outputs the electric signals to the image signal processor 80. The image pickup devices 20 may be CCD (charge-coupled device) sensors or CMOS (complementary metal-oxide semiconductor) image sensors.

The voice coil motor 12, which is an element used to adjust the position of the lens 5, moves the lens 5 along an optical axis in response to a drive signal supplied from the focus control circuit 100. Thereby, the focal lengths of the lens 5 and the image pickup devices 16 are adjusted.

The hall element 14 is an element used to detect the position of the lens 5. The voice coil motor 12 and the hall element 14 are provided in an actuator (this actuator being comprised of the voice coil motor 12 and the hall element 14 will be referred to as "camera module 10" in this patent specification (See FIG. 3 and FIG. 5)).

The image signal processor 80 processes image signals outputted from the image pickup devices 20. In the present embodiment, the image signal processor 80 principally determines a target position of the lens 5, based on the image signals outputted from the image pickup devices 20.

Figure 2:
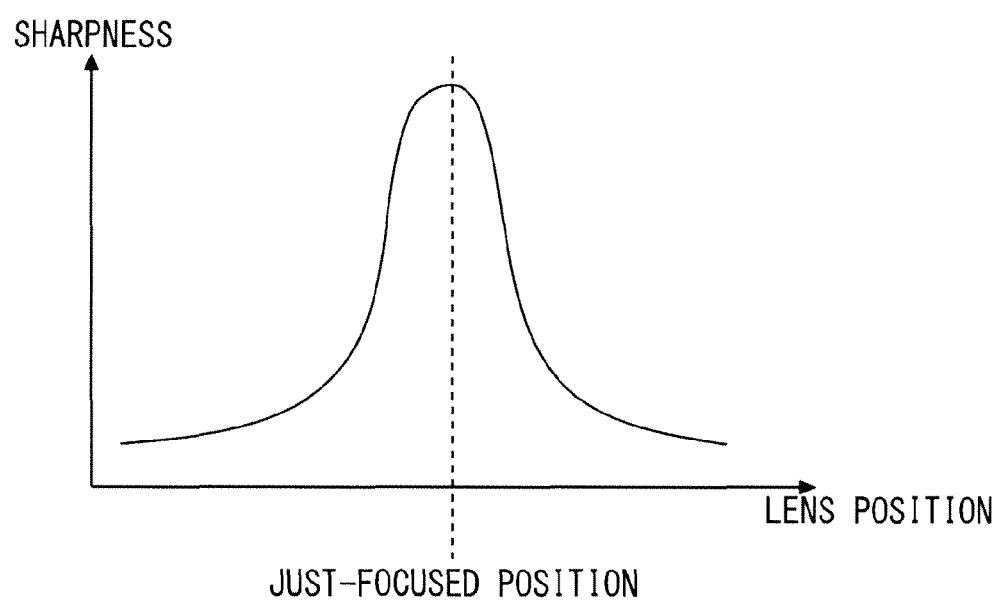
FIG. 2 is a graph to explain a processing, performed by an image signal processor, to determine the target position of a lens.

FIG. 2 is a graph to explain a processing, performed by the image signal processor 80, to determine the target position of the lens 5. As an auto-focusing function, such as pressing a shutter button halfway, is activated, the image signal processor 80 transmits a control signal by which to move the lens 5 stepwise at a predetermined step width to the focus control circuit 100. In so doing, the image signal processor 80 calculates the sharpness of each image signal picked up in each position of the lens 5. For example, the sharpness thereof may be obtained and evaluated in such a manner that an edge component of each image signal is extracted by subjecting the image signal to a high-pass filter and then the edge component of each image signal is accumulated. The image signal processor 80 determines the position of the lens 5 where the sharpness becomes maximum, to be a just-focused position.

Referring back to FIG. 1, the focus control circuit 100 includes a hall element control circuit 30, a low-pass filter 42, an analog-to-digital converter (ADC) circuit 44, an equalizer 50, a PWM modulator 60, and an H-bridge driver unit 70. If the focus control circuit 100 is packaged into a single-chip LSI, the low-pass filter 42 may be provided external to the single-chip LSI.

The hall element control circuit 30, which is a circuit for controlling the hall element 14, includes a differential amplifier circuit 32 and a constant-current driver circuit 34. The differential amplifier circuit 32 amplifies a potential difference between the output terminals of the hall element 14, and outputs the amplified potential difference thereof as a position signal. The hall element 14, which is fixed to a casing that constitutes a focus control mechanism, outputs a voltage proportional to the magnetic flux density of magnetic field formed by a magnet fixed to the lens 5. As the magnetic flux density varies due to a movement of the lens 5, the output voltage of the hall element 14 varies in proportion to the variation in magnetic flux density. Thus, the position of the lens 5 can be estimated based on the output voltage of the hall element 14. It is appreciated that even though the magnet is of a structure such that the hall element 14 is fixed to the lens 5 and the magnet is fixed to the casing, the position of the lens 5 can also be estimated from the output voltage of the hall element 14. The constant-current driver circuit 34 will be discussed later.

The low-pass filter 42 removes the high-frequency components of the position signal outputted from the differential amplifier circuit 32. The analog-to-digital converter circuit 44 converts the position signal outputted from the low-pass filer 42, from analog values into digital values.

The equalizer 50 generates a control signal used to adjust the position of the lens 5 to the target position, based on a difference between the position of the lens 5 identified by the output signal of the hall element 14 and the target position of the lens 5 set externally. Note here that the target position of the lens 5 set externally corresponds to the target position of the lens 5 set by the image signal processor 80.

A more detailed description will now be given here. The equalizer 50 includes a subtraction circuit 52 and a servo circuit 54. The subtraction circuit 52 calculates a difference between the position signal outputted from the position detecting element 14 and the target position signal inputted from the image signal processor 80, and then outputs the calculated difference as error signal. If the position of the lens 5 is in the target position, the difference therebetween will be zero. The servo circuit 54 generates a signal used to cancel out the error signal outputted from the subtraction circuit 52, and outputs the thus generated signal to the PWM modulator 60.

The PWM modulator 60 generates a PWM signal in response to the control signal generated by the equalizer 50. More specifically, the PWM modulator 60 converts the control signal inputted from the equalizer 50, into a pulse signal having a duty ratio that corresponds to the digital value thereof. The H-bridge driver unit 70 generates a drive current used to drive the voice coil motor 12 that varies the position of the lens 5 according to the PWM signal generated by the PWM modulator 60. More specifically, the H-bridge driver unit 70 generates the drive current having a direction and an amount according to the PWM signal inputted from the PWM modulator 60, and supplies it to the voice coil motor 12. Thereby, the lens 5 can be moved to and converged to the target position.

Figure 3:
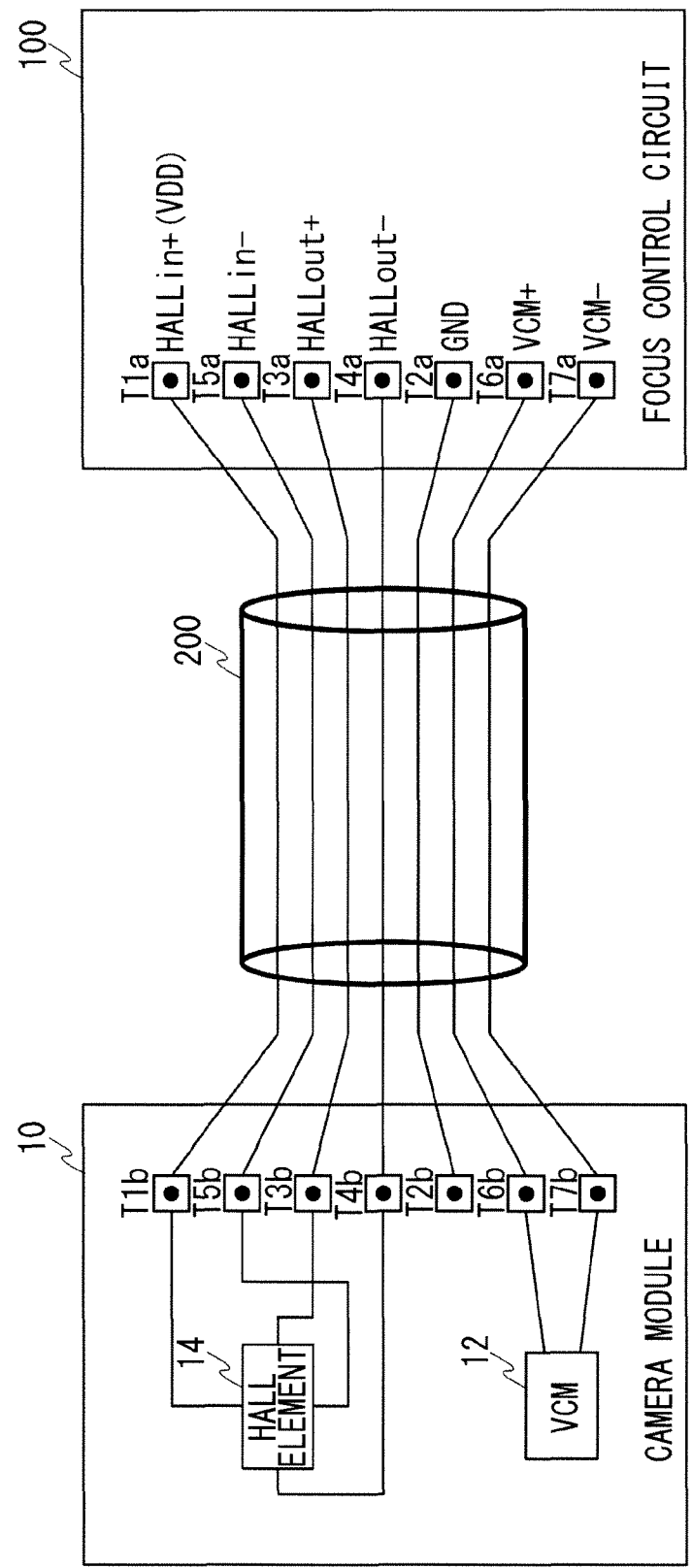
FIG. 3 shows an example where a camera module, a focus control circuit and a wiring member according to a comparative example are implemented.

FIG. 3 shows an example where the camera module 10, the focus control circuit 100 and the wiring member 200 according to a comparative example are implemented. The focus control circuit 100 is connected to the camera module 10 (namely, the hall element 14 and the voice coil motor 12) via the wiring member 200.

In this comparative example, the focus control circuit 100 includes a first terminal T1a, a second terminal T2a, a third terminal T3a, a fourth terminal T4a, a fifth terminal T5a, a sixth terminal T6a, and a seventh terminal T7a. The camera module 10 includes a first terminal T1b, a second terminal T2b, a third terminal T3b, a fourth terminal T4b, a fifth terminal T5b, a sixth terminal T6b, and a seventh terminal T7b corresponding respectively to the terminals T1a to T7a. The terminals T1a to T7a are electrically connected to the terminals T1b to T7b, respectively, through wirings.

In this example, the wiring member 200 is formed of a film-like flexible wiring. Though the seven wirings of FIG. 3 are illustrated in such a manner that each of the wirings has the same diameter, a ground wiring is actually provided on the entire back side of the flexible wiring as a ground layer. The ground layer achieves shielding effectiveness.

The wiring between the first terminals T1a and T1b is one used to transmit a high-potential-side bias voltage from the focus control circuit 100 to the hall element 14. In the case of FIG. 3, the power supply voltage is transmitted. The wiring between the fifth terminals T5a and T5b is one used to transmit a low-potential-side bias voltage from the focus control circuit 100 to the hall element 14. The wiring between the third terminals T3a and T3b is one used to transmit a positive-potential-side output voltage from the hall element 14 to the focus control circuit 100. The wiring between the fourth terminals T4a and T4b is one used to transmit a negative-potential-side output voltage from the hall element 14 to the focus control circuit 100. The wiring between the second terminals T2a and T2b is the ground wiring.

The wiring between the sixth terminals T6a and T6b is one used to transmit a positive-side drive signal from the focus control circuit 100 to the voice coil motor 12. The wiring between the seventh terminals T7a and T7b is one used to transmit a negative-side drive signal from the focus control circuit 100 to the voice coil motor 12. Note that since the drive of the voice coil motor 12 is given no attention in the present patent specification, the wiring between the sixth terminals T6a and T6b and the wiring between the sixth terminals T7a and T7b are ignored herein.

Figure 4:
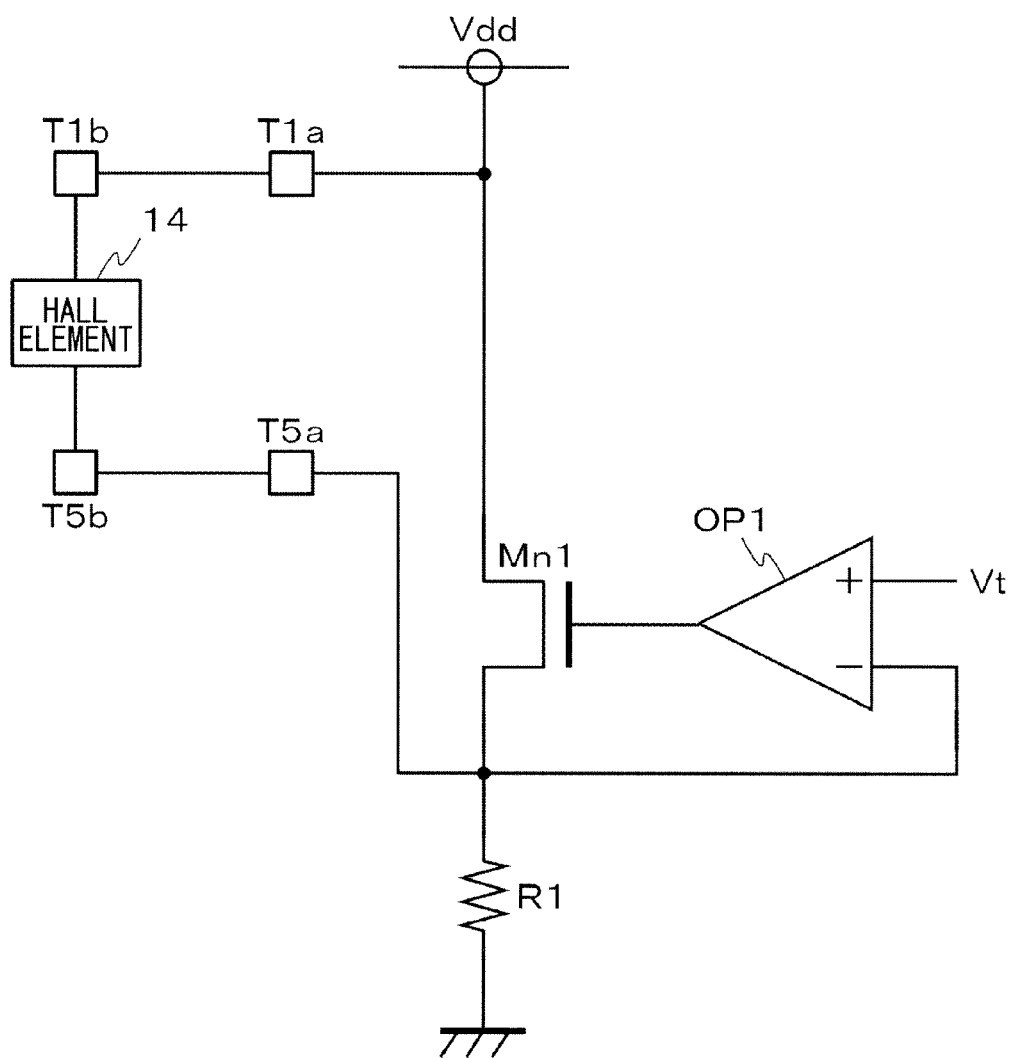
FIG. 4 shows is a circuit diagram showing an exemplary configuration of a hall element and a constant-current driver circuit according to the comparative example.

FIG. 4 shows is a circuit diagram showing an exemplary configuration of the hall element 14 and the constant-current driver circuit 34 according to the comparative example. In the constant-current driver circuit 34 at a focus control circuit 100 side, an N-channel type transistor Mn1 and a resistor R1 are connected in series between a power supply potential Vdd and a ground potential. A predetermined set voltage Vt is inputted to a noninverting input terminal of an operational amplifier OP1, whereas a connection point voltage between the N-channel type transistor Mn1 and the resistor R1 is inputted to an inverting input terminal of the operational amplifier OP1. An output terminal of the operational amplifier OP1 is connected to a gate terminal of the N-channel type transistor Mn1.

The power supply potential Vdd is inputted to the first terminal T1$b$ of the hall element 14 as the high-potential-side bias voltage. The connection point voltage between the N-channel type transistor Mn1 and the resistor R1 is inputted to the fifth terminal T5$b$ of the hall element 14 as the low-potential-side bias voltage.

The output voltage of the hall element 14 is defined by the following Equation (1).

$$V = \alpha \cdot I \cdot B \quad (1)$$

where $\alpha$ is a device parameter, I the bias current and B the magnetic flux density.

In the case of FIG. 4, the hall element 14 is driven by a constant current. In other words, the operational amplifier OP1 keeps the connection point voltage between the N-channel type transistor Mn1 and the resistor R1 constant by controlling the gate voltage of the N-channel type transistor Mn1, and thereby performs control such that a constant-current bias current from a constant current source can flow through the hall element 14. Although the output voltage paths of the hall element 14 are omitted in FIG. 4, they are inputted to the input terminals of the differential amplifier circuit 32 via the wiring between the third terminals T3$a$ and T3$b$ and the wiring between the fourth terminals T4$a$ and T4$b$.

Figure 5:
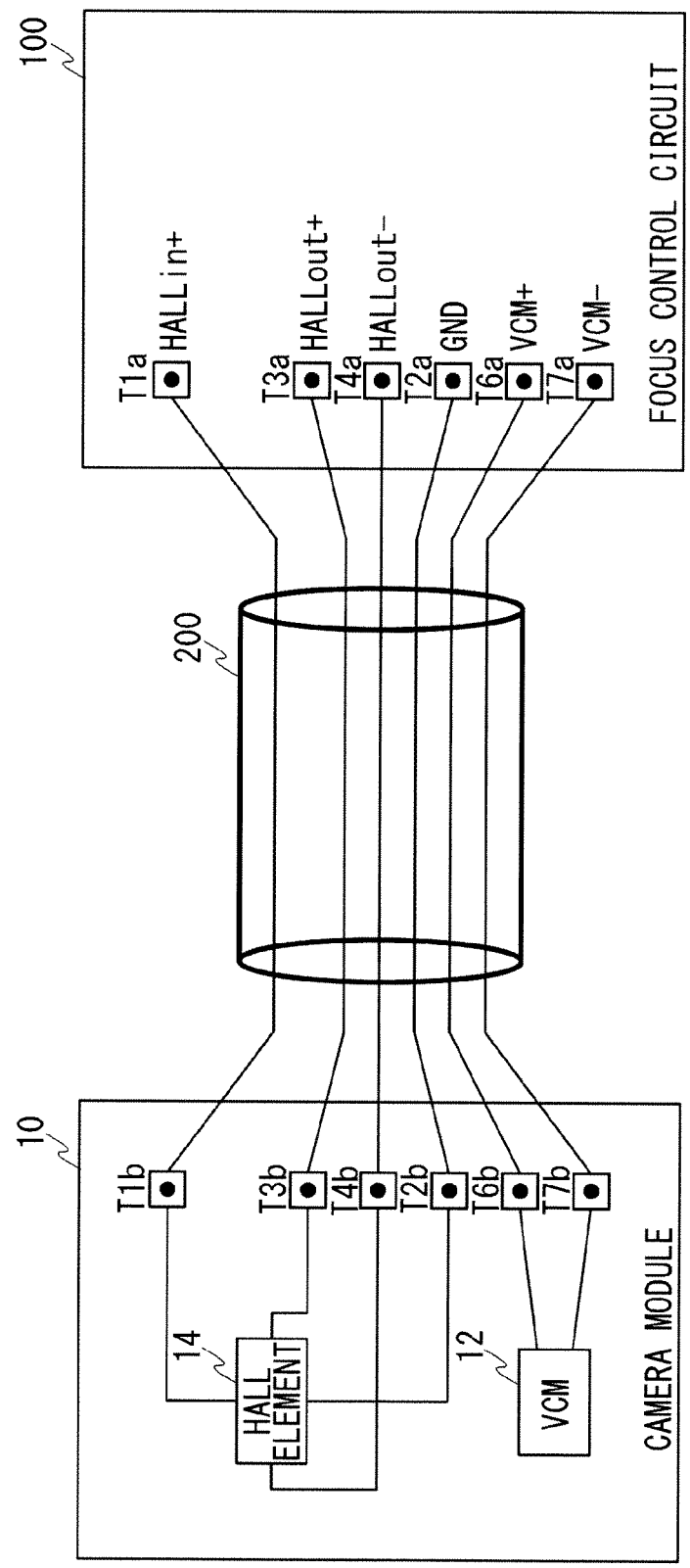
FIG. 5 shows an example where a camera module, a focus control circuit and a wiring member according to an embodiment of the present invention are implemented.

FIG. 5 shows an example where the camera module 10, the focus control circuit 100 and the wiring member 200 according to an embodiment of the present invention are implemented. The configuration shown in FIG. 5 is such that the fifth terminal T5$a$ of the focus control circuit 100, the fifth terminal 5$b$ of the camera module 10 and the wiring between the fifth terminal T5$a$ and the fifth terminal T5$b$ are omitted as compared with FIG. 3.

Figure 6:
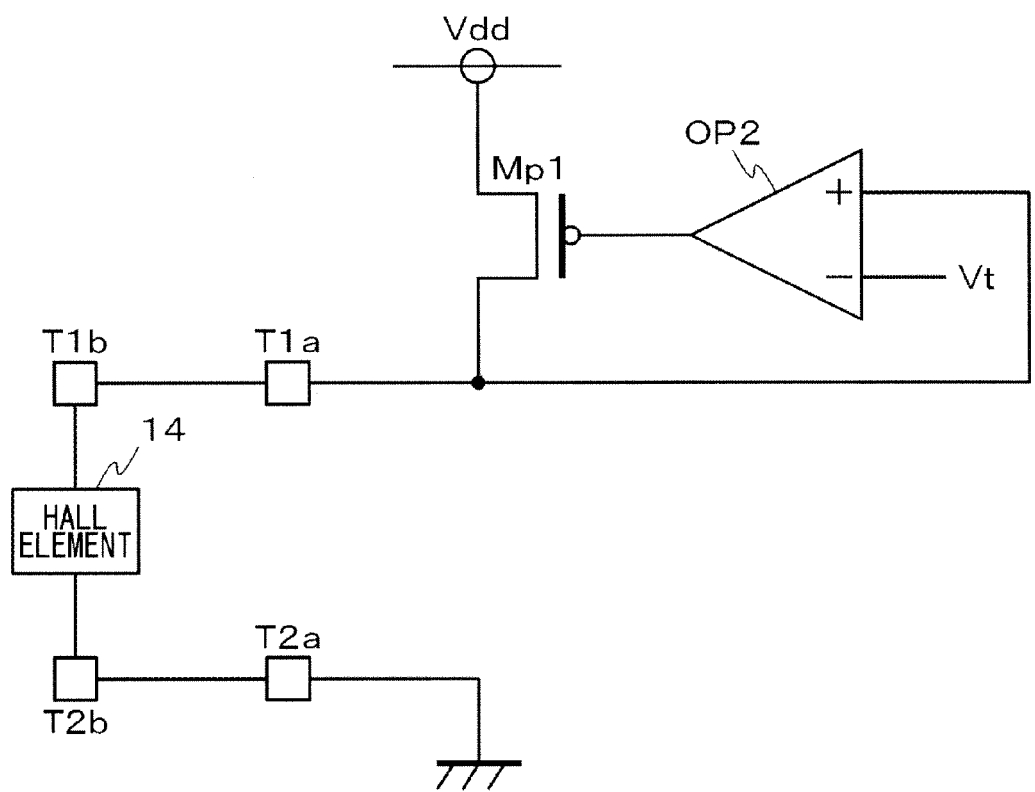
FIG. 6 is a circuit diagram showing a first exemplary configuration of a hall element and a constant-current driver circuit according to an embodiment of the present invention.

FIG. 6 is a circuit diagram showing a first exemplary configuration of the hall element 14 and the constant-current driver circuit 34 according to the embodiment of the present invention. In the constant-current driver circuit 34 at a focus control circuit 100 side, a P-channel type transistor Mp1 is connected between the power supply potential Vdd and the first terminal T1$a$. More specifically, a source terminal thereof is connected to the power supply potential Vdd, and a drain terminal thereof is connected to the first terminal T1$a$.

A predetermined set voltage Vt is inputted to a noninverting input terminal of an operational amplifier OP2, whereas a voltage at the first terminal T1$a$ is inputted to an inverting input terminal of the operational amplifier OP1. An output terminal of the operational amplifier OP2 is connected to a gate terminal of the P-channel type transistor Mp1. The operational amplifier OP2 controls the gate voltage of the P-channel type transistor Mp1 by differentially amplifying the voltage between the predetermined set voltage Vt and the voltage at the first terminal T1$a$. With this control, the bias voltage supplied to the first terminal T1$b$ of the hall element 14 via the first terminal T1$a$ is kept at a constant voltage. A ground potential is supplied to the second terminal T2$b$ of the hall element 14 via the second terminal T2$a$.

Figure 7:
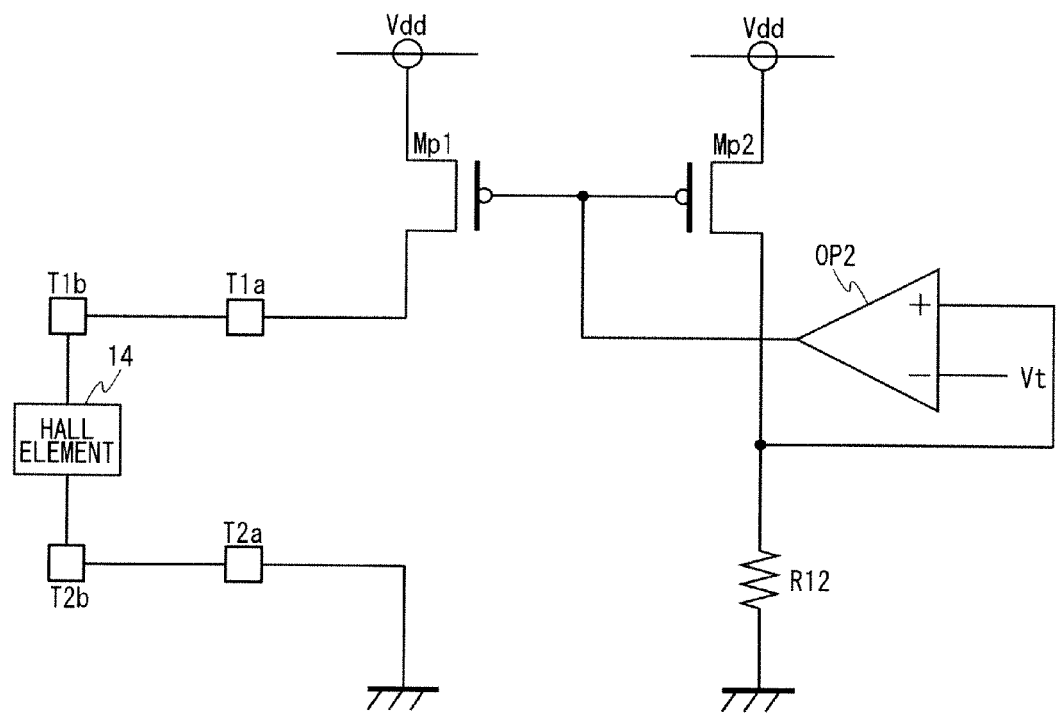
FIG. 7 is a circuit diagram showing a second exemplary configuration of a hall element and a constant-current driver circuit according to an embodiment of the present invention.

FIG. 7 is a circuit diagram showing a second exemplary configuration of the hall element 14 and the constant-current driver circuit 34 according to the embodiment of the present invention. The second exemplary configuration is an example where a configuration of current mirrors is employed. A current mirror circuit is configured by (1) a first series circuit comprised of the P-channel type transistor Mp1 and the hall element 14 connected in series with each other and (2) a second series circuit comprised of a P-channel type transistor Mp2 and a resistor R12 connected in series with each other.

The operational amplifier OP2 uses the connection point voltage between the P-channel type transistor Mp2 and the resistor R12 as a mirror voltage of high-potential-side input terminal voltage of the hall element 14. That is, the operational amplifier OP2 differentially amplifies a predetermined set voltage Vt and the connection point voltage and controls the gate voltage of the P-channel type transistor Mp1 and the P-channel type transistor Mp2.

Comparing FIG. 3 and FIG. 5, the wiring member 200 of FIG. 5, which is used to transmit the input-output voltage of the hall element 14, is configured by four wirings which are (1) a wiring that transmits the bias voltage from the hall element control circuit 30 to the hall element 14, (2) a wiring that transmits the positive-potential-side output voltage from the hall element 14 to the hall element control circuit 30, (3) a wiring that transmits the negative-potential-side output voltage from the hall element 14 to the hall element control circuit 30, and (4) the ground wiring. In contrast thereto, the wiring member of FIG. 3 is configured by five wirings.

By employing the embodiments as described above, a constant voltage is supplied to the high-potential-side input terminal of the hall element 14 so as to drive the hall element by a constant current. Thus, the camera module and its input-output wiring can be simplified. When a device is to be driven by a constant current, in most cases an N-channel type transistor is generally provided between the low-potential-side input terminal thereof and the ground thereof. This is because the N-channel type transistor has a lower on-resistance than the P-channel type transistor, and therefore the N-channel type transistor has a higher current efficiency than the P-channel transistor.

In contrast to this, according to the present embodiments, a P-channel type transistor is provided between the high-potential-side input terminal and the power supply potential of the hall element 14, so that the number of terminals for the camera module 10 and that for the focus control circuit 100 can each be reduced by one terminal. This is because the ground terminal serves the purpose of the low-potential-side input terminal of the hall element 14 which is otherwise used. Also, the number of wirings for the wiring member 200 can be reduced by one.

The description of the present invention given above is based upon illustrative embodiments. These embodiments are intended to be illustrative only and it will be obvious to those skilled in the art that various modifications to constituting elements and processes could be further developed and that such additional modifications are also within the scope of the present invention.

In the above-described embodiments, a description has been given of an example where a voice coil motor is used for the driver element. However, this should not be considered as limiting and, for example, a piezo element may be used instead. This modification may be applicable to a case where a moving object, such as the piezo element, is moved by performing feedback control of the position signal of this moving object.

What is claimed is:

1. A hall element control circuit, connected to a hall element via a wiring member, for controlling the hall element, the hall element control circuit comprising:
- a first terminal for supplying a bias voltage to a high-potential-side input terminal of the hall element;
- a second terminal final for supplying a ground potential to a low-potential-side input terminal of the hall element;
- a first transistor whose source terminal is connected to a power supply potential and whose drain terminal is connected to said first terminal; and
- an operational amplifier for controlling a gate voltage of said first transistor by differentially amplifying a voltage between a predetermined set voltage and a voltage at said first terminal; and
- a second transistor and a resistor connected in series with each other so as to constitute a current mirror circuit together with a first series circuit where said first transistor and the hall element are connected in series with each other,
- wherein said operational amplifier uses a connection point voltage between the second transistor and the resistor as a mirror voltage of high-potential-side input terminal voltage of the hall element.

2. A hall element control circuit according to claim 1, further comprising:
- a third terminal for receiving a supply of a high-potential-side output voltage of the hall element; and
- a fourth terminal for receiving a supply of a low-potential-side output voltage of the hall element.

3. A hall element control circuit according to claim 1, wherein said wiring member is configured by four wirings, used to transmit an input-output voltage of the hall element, which are:
- (1) a wiring that transmits the bias voltage from said hall element control circuit to the hall element;
- (2) a wiring that transmits a positive-potential-side output voltage from the hall element to said hall element control circuit;
- (3) a wiring that transmits a negative-potential-side output voltage from the hall element to said hall element control circuit; and
- (4) a ground wiring.

* * * * *